(12) United States Patent
Noguchi et al.

(10) Patent No.: US 7,170,504 B2
(45) Date of Patent: Jan. 30, 2007

(54) DISPLAY APPARATUS WHERE VOLTAGE SUPPLY REGION AND CONTROL CIRCUIT THEREIN ARE STACKED

(75) Inventors: Yukihiro Noguchi, Gifu (JP); Akifumi Sasaki, Oogaki (JP); Junka Kaya, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 516 days.

(21) Appl. No.: 10/669,006

(22) Filed: Sep. 24, 2003

(65) Prior Publication Data
US 2004/0061694 A1 Apr. 1, 2004

(30) Foreign Application Priority Data
Sep. 27, 2002 (JP) .............................. 2002-283398

(51) Int. Cl.
*G09G 5/00* (2006.01)
(52) U.S. Cl. .................. 345/204; 345/55; 345/76; 345/87; 345/92
(58) Field of Classification Search ................ 345/204, 345/55, 76, 87, 92
See application file for complete search history.

(56) References Cited

U.S. PATENT DOCUMENTS 5,789,766 A * 8/1998 Huang et al. ................. 257/88
6,030,548 A * 2/2000 Kuriyama ................. 257/368
6,552,705 B1 * 4/2003 Hirota ......................... 345/92

FOREIGN PATENT DOCUMENTS

| JP | 61-46974 A | 3/1986 |
|---|---|---|
| JP | 2001-109395 | 4/2001 |
| JP | 2001-1255515 A * | 9/2001 |
| JP | 2002-32058 | 1/2002 |
| JP | 2003-271075 A | 9/2003 |

OTHER PUBLICATIONS

Japanese Office Action issued in corresponding Japanese Patent Application No. 2002-283398, dated Aug. 29, 2006.

* cited by examiner

*Primary Examiner*—Richard Hjerpe
*Assistant Examiner*—Leonid Shapiro
(74) *Attorney, Agent, or Firm*—McDermott Will & Emery LLP

(57) ABSTRACT

In a display apparatus, a first data control circuit, a second data control circuit, a first selection control circuit and a second selection control circuit, all disposed in the periphery of a display region, and a power supply region are formed in a manner such that at least part of the first data control circuit, second data control circuit, first selection control circuit and second selection control circuit is overlapped with the power supply region. The power supply region and a cathode region are provided over a large area in a layer or layers different from the above-mentioned circuits disposed in the periphery of the display region.

20 Claims, 8 Drawing Sheets

DISPLAY APPARATUS WHERE VOLTAGE SUPPLY REGION AND CONTROL CIRCUIT THEREIN ARE STACKED

BACKGROUND OF THE INVENTION

1. Field of the Invention

The present invention relates to display apparatus, and it particularly relates to a technology by which to improve the electrical characteristics and the degree of design freedom in the active matrix display apparatus.

2. Description of the Related Art

The use of notebook type personal computers and portable terminals is spreading rapidly. Displays mainly used for such equipment are liquid crystal displays, but the display considered promising as a next-generation flat display panel is the organic EL (Electro Luminescence) display. It is the active matrix drive system that is central as a display method for such displays. The display using this system is called the active matrix display where a multiplicity of pixels are vertically and horizontally disposed in a matrix, and a switching element is provided for each pixel. Image data are written sequentially for each pixel line by the switching element. A variety of designs for achieving the practical organic EL displays are being proposed. One example of such designs is disclosed in Japanese Patent Application Laid-Open No. 2002-32058 or No. 2001-109395.

An organic EL display is comprised mainly of a display region constituted by a multiplicity of pixels and a peripheral region around the display region. Disposed in the peripheral region are display control circuits, signal lines, power supply lines and so forth. In designing the organic EL display, which is now on its way for wider acceptance in the world, attempts to improve electrical characteristics and achieve smaller size for the equipment are among the most important considerations in gaining greater competitiveness for the product in the market. Those two goals may often be regarded as opposing factors in design. However, the inventors have discovered that they can be reconciled with each other and even coexist through a set of improvements in packaging design.

SUMMARY OF THE INVENTION

The present invention has been made in view of the foregoing circumstances and an object thereof is to realize an improvement of electrical characteristics of an organic EL display and the smaller size for the peripheral circuits thereof at the same time. Another object of the present invention is to obtain display of higher grade by reducing the voltage drop of power supply. Still another object of the present invention is to arrange and dispose the circuits and signal lines in the peripheral region in a more efficient manner. Still another object of the present invention is to protect the peripheral circuits and signal lines against noise and static electricity.

A preferred embodiment according to the present invention relates to a display apparatus. This apparatus includes a pixel circuit, a display control circuit which controls the pixel circuit and a supply region for supplying a predetermined voltage used to drive the pixel circuit. The pixel circuit, the display control circuit and the supply region are formed by a stacking process in a manner such that at least part of the display control circuit overlaps the supply region in a stacking direction thereof.

The "pixel circuit" includes an optical element, a drive element which drives the optical element, and a switching element which switches the on/off of emission of the optical element. What is mainly assumed here as the optical element is an organic light emitting diode (hereinafter referred to as "OLED"). And what is mainly assumed here as the drive element or the switching element is a metal oxide semiconductor (MOS) transistor or a thin film transistor (TFT). The pixel circuits are arranged mainly in a matrix so as to form a display region.

The "display control circuit" may be a data control circuit that sends luminance data to the pixel circuit. In such a case, the luminance data may be outputted in a column direction with respect to the matrix-like arrangement of the pixel circuits. The "column direction" means the vertical direction on a display surface where a plurality of pixel circuits are disposed in horizontal and vertical directions. This data control circuit may include mainly a shift register, a buffer and a switching circuit, and it may be formed in a manner such that at least one of these elements overlaps the supply region supplying the predetermined voltage. The luminance data is data relating to luminance information to be set to the drive element, and must be distinguished from the intensity of the light that the optical element emits.

The "display control circuit" may be a selection control circuit which sends a selection signal to the pixel circuit. In such a case, the display control circuit may output the selection signal in a row direction with respect to the matrix-like arrangement of the pixel circuits. The "row direction" means the horizontal direction on the display surface where a plurality of pixel circuits are disposed in horizontal and vertical directions. This selection control circuit may include mainly a shift register and a buffer, and it may be formed in a manner such that at least one of these elements overlaps with the supply region supplying the predetermined voltage. The selection signal indicates a writing timing of the luminance data, and the pixel line is scanned based on this selection signal. The selection signal controls the on and off of the switching elements, and a selection signal line is provided separately, for example, for each row of the pixel row.

The "stacking direction" indicates a direction of overlapping in which the pixel circuit, the display control circuit and the supply region are overlapped with one another. The supply region may be provided on above or below the display control circuit in the stacking direction. The "predetermined voltage" may be the voltage at either an anode side or cathode side of the optical element, and it is not limited to the power supply voltage but may be the ground voltage or negative voltage. In particular, if a region where the power supply voltage is interconnected is provided in a layer different from that for the display control circuit, then a larger space is obtained. Thus, the supply lines for the power supply voltage can be made thicker. Thereby, the voltage drop of the power supply can be reduced, thus contributing to improve the display grade.

If the display control circuit and the supply region are provided in separate layers, a space necessary for placing the display control circuit and power supply line in the periphery of the display region can be suppressed and minimized. Thus, the size of a casing therefor can be easily made smaller. As a result thereof, when the power supply line or the respective signal lines are to be connected to an external unit, the effect of possibly shortening the wiring length thereof can be realized. Moreover, the signal lines and circuits contained in the display control circuit can be placed closer to a power supply region in the stacking direction.

Thus, the increased capacity is obtained for each element, so that the adverse effect of noise and static electricity on the signals can be reduced.

Another preferred embodiment according to the present invention relates also to a display apparatus. This apparatus includes: a display region in which a plurality of pixel circuits are arranged in a matrix; a display control circuit, disposed outside the display region, which controls the plurality of pixel circuits in a row or column direction; a supply region for supplying a predetermined voltage used to drive the plurality of pixel circuits; and a connecting member which electrically connects the display apparatus to an external unit, so as to introduce a signal to be referred to by the display control circuit and the predetermined voltage. The pixel circuit, the display control circuit and the supply region are formed by a stacking process in a manner such that at least part of the display control circuit overlaps with the supply region in layers from the connecting member up to the supply region in a stacking direction thereof.

The "signal" to be referred to may be, for example, luminance data, a clock signal, a start signal and so forth. The "connecting member which electrically connects" may be, for example, an external input terminal, and the power supply region may be formed in such a manner as to overlap with the display control circuit or a wiring region for the signal to be referred to in a layer from the external input terminal up to the display region. By implementing this structure, the advantageous effects are produced where the display quality is improved due to the reduction of voltage drops in the power supply, the casing is made smaller and the respective elements are protected against the noise, static electricity and so forth.

At least part of a region, in which the signal to be referred to is interconnected, may be formed in such a manner as to overlap with the power supply region. As these elements are placed closer to each other, the increased capacity is obtained, so that the adverse effect of noise and static electricity on the signals can be reduced. In particular, the significant effect is produced where the luminance data are protected against the noise or static electricity.

Moreover, a plurality of the connecting members may be provided in the periphery of the display apparatus. A plurality of the display control circuits may be provided according to the number of the connecting members. The number of the signals to be referred to and a region thereof to be interconnected are determined according to the number of the connecting members and display control circuits. The control circuits, the wiring region and the supply region are formed in a manner such that at least part of the plurality of the control circuits and the wiring region for the plurality of signals to be referred to is overlapped with the supply region in layers from the plurality of connecting members up to the display region.

The connecting member may be provided above or below the display apparatus. It may be provided above and below the display apparatus, for one each or two each thereof. Moreover, the connecting member may be provided on both left and right sides of the display apparatus, and each of the thus provided connecting members may include a power supply terminal of anode and cathode. Positions and layout of the plurality of connecting members, the plurality of interconnection for the signals to be referred to and the plurality of display control circuits may be arranged in a manner such that vertical or horizontal symmetry is maintained. The supply region may be formed in a manner such that at least one of these is substantially uniformly overlapped with the supply region in a vertical or horizontal direction.

The display region constituted by a plurality of pixel circuits may be divided into sub-regions, and in order to simultaneously control the display of these the plurality of display control circuits may control the plurality of pixel circuits at separate timing for each of the sub-regions. The number and position of the display control circuits disposed in the periphery of the display region may be determined based on the number of division of the display region, namely, the number of the sub-regions. As the number of division of the display region, two vertical times four horizontal (2×4) sub-regions, for example, may be adopted so that the vertical or horizontal symmetry can be maintained in the layout of the display control circuits and the signal lines disposed in the periphery thereof. The plurality of sub-regions may be formed in a manner such that at least part of the plurality of sub-regions overlaps with the supply region.

Still another preferred embodiment according to the present invention relates also to a display apparatus. This apparatus includes: a pixel circuit; a display control circuit which controls the pixel circuit; and a supply region for supplying a predetermined voltage used to drive the pixel circuit. The pixel circuit, the display control circuit and the supply region may be formed in a plurality of stacking layers and formed in a manner such that at least part of the display control circuit overlaps with the supply region in a stacking direction thereof.

It is to be noted that any arbitrary combination of the above-described structural components and expressions changed between a method, an apparatus, a system, a computer program, a recording medium and so forth are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

In known arrangements, a pixel circuit, a display control circuit, a wiring region for signals referred to by the display control circuit, and a voltage supply region are all provided in the same layer, so that they cannot be placed one on top of the other, namely, they cannot be placed in an overlapped manner. In the conventional practice, therefore, it is necessary to provide the voltage supply region in a position where it does not overlap other peripheral circuits, such as between a display control circuit and a display region. In the present embodiments, a voltage supply region provided in a layer other than those for other circuits, or regions, realizes an arrangement in which those circuits, or regions, are formed in a plurality of overlapping layers in a stacking process. A structure of this kind contributes to the realization of improvements in electrical characteristics of an organic EL display and smaller size for the equipment thereof at the same time as mentioned earlier.

In the present embodiments, an active matrix type organic EL display is assumed as a display apparatus, and the description thereof will be given using, in particular, an example in which a region for supplying power-supply voltage is provided in a layer different from the other layers.

First Embodiment

Figure 1:
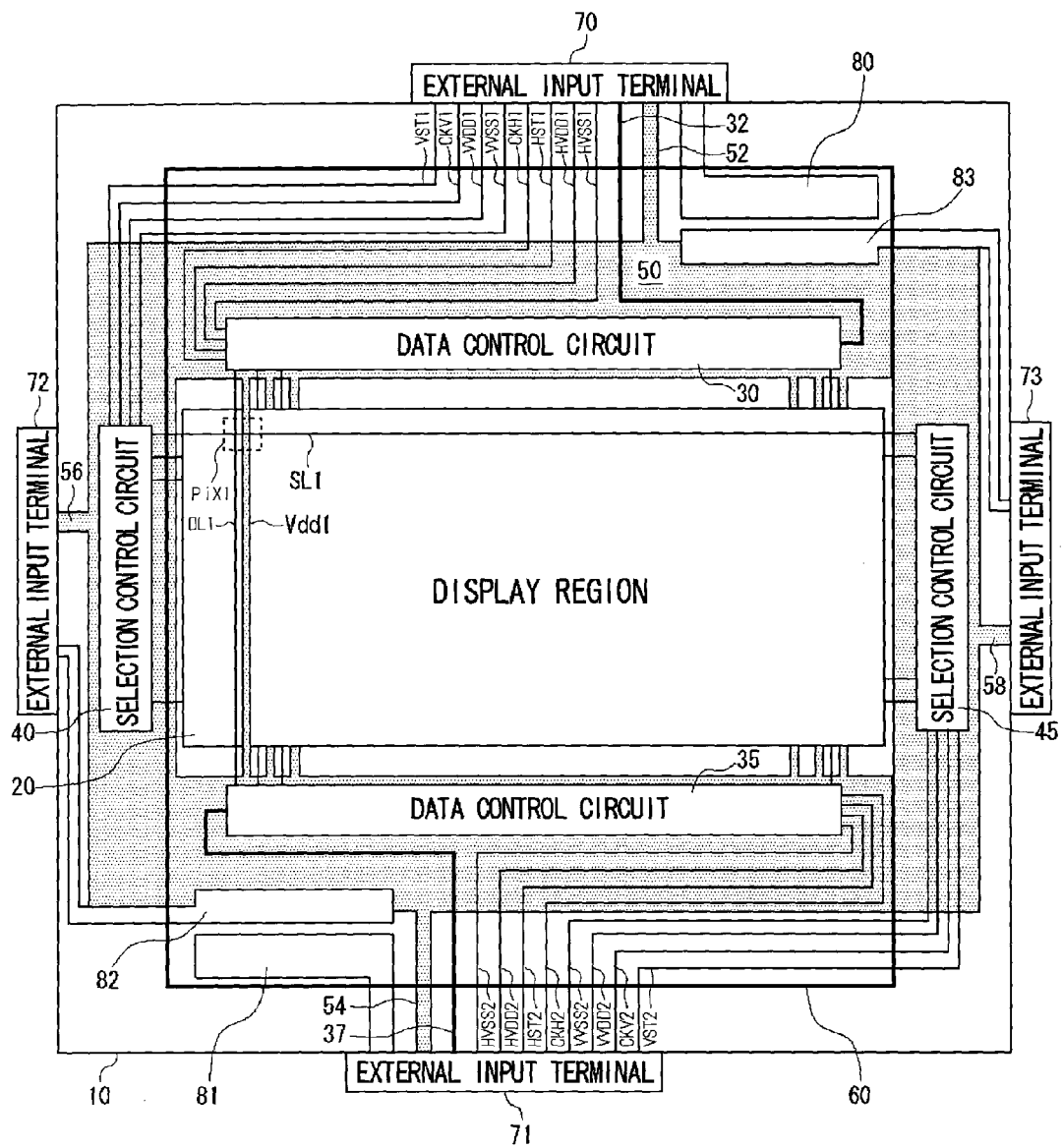
FIG. 1 shows a structure of a display apparatus according to a first embodiment of the present invention.

FIG. 1 shows a structure of a display apparatus according to a first embodiment of the present invention. A display region 20 is provided approximately in the center of the display apparatus 10. The display region 20 is structured in a matrix array of a large number of pixels as shown in a pixel circuit Pix1. A first data control circuit 30 and a second data control circuit 35, which output luminance data to each pixel through a plurality of data lines wired in the column direction of the display region 20, are provided above and below the display region 20, respectively. A first selection control circuit 40 and a second selection control circuit 45, which output write timing signals for the luminance data to each pixel through a plurality of selection lines wired in the row direction of the display region 20, are provided to the left and the right of the display region 20, respectively.

A power supply region 50, which is a layer containing the interconnection of power-supply voltage supply lines connected to external input terminals, is arranged in such a manner that it overlaps at least part of the first data control circuit 30, the second data control circuit 35, the first selection control circuit 40, the second selection control circuit 45 and the respective signal lines. Namely, the power supply region 50 is provided in a layer separate from the one or ones for the control circuits and signal lines, and the layers are insulated against each other. Accordingly, as shown in FIG. 1, the power supply region 50 can be disposed over almost the entire periphery of the display region 20 and thus the power supply lines can be made thicker, so that voltage drops along them can be reduced. The power supply region 50 is connected to a first external input terminal 70, a second external input terminal 71, a third external input terminal 72 and a fourth external input terminal 73 via a first main power supply line 52, a second main power supply line 54, a third main power supply line 56 and a fourth main power supply line 58, respectively.

From the power supply region 50, a number of power supply lines equal to the number of pixel columns are wired in the column direction of the display region 20. Even in the display region 20, where power supply lines are provided in a separate layer, the power supply lines may be wired with thicker lines. A cathode region 60 is positioned in such a manner as to cover the first data control circuit 30, the second data control circuit 35 and the display region 20. This cathode region 60 is also provided in a layer separate from the other circuits, and the layer is insulated against the other layers. The cathode region 60 is connected to a first external input terminal 70, a second external input terminal 71, a third external input terminal 72 and a fourth external input terminal 73 via a first cathode contact 80, a second cathode contact 81, a third cathode contact 82 and a fourth cathode contact 83, respectively.

A first set signal VST1, a first clock signal CKV1, a first power supply VVDD1 and a second power supply VVSS1 are inputted from the first external input terminal 70 to the first selection control circuit 40 via their respective signal lines. A second set signal HST1, a second clock signal CKH1, a third power supply HVDD1 and a fourth power supply HVSS1 are inputted from the first external input terminal 70 to the first data control circuit 30 via their respective signal lines. A first main data line 32 transmits luminance data signals inputted from the first external input terminal 70 to the first data control circuit 30. The wiring region of at least part of these signal lines overlaps with the power supply region 50. This arrangement can reduce the adverse effects of noise and static electricity. In particular, the effects of noise on luminance data to be transmitted by the first main data line 32 can be reduced.

A third set signal VST2, a third clock signal CKV2, a fifth power supply VVDD2 and a sixth power supply VVSS2 are inputted from the second external input terminal 72 to the second selection control circuit 45 via their respective signal lines. A fourth set signal HST2, a fourth clock signal CKH2, a seventh power supply HVDD2 and an eighth power supply HVSS2 are inputted from the second external input terminal 71 to the second data control circuit 35 via their respective signal lines. A second main data line 37 transmits luminance data signals inputted from the second external input terminal 71 to the second data control circuit 35. The wiring region of at least part of these signal lines also overlaps with the power supply region 50, so that the adverse effects of noise and static electricity can be reduced.

Figure 2:
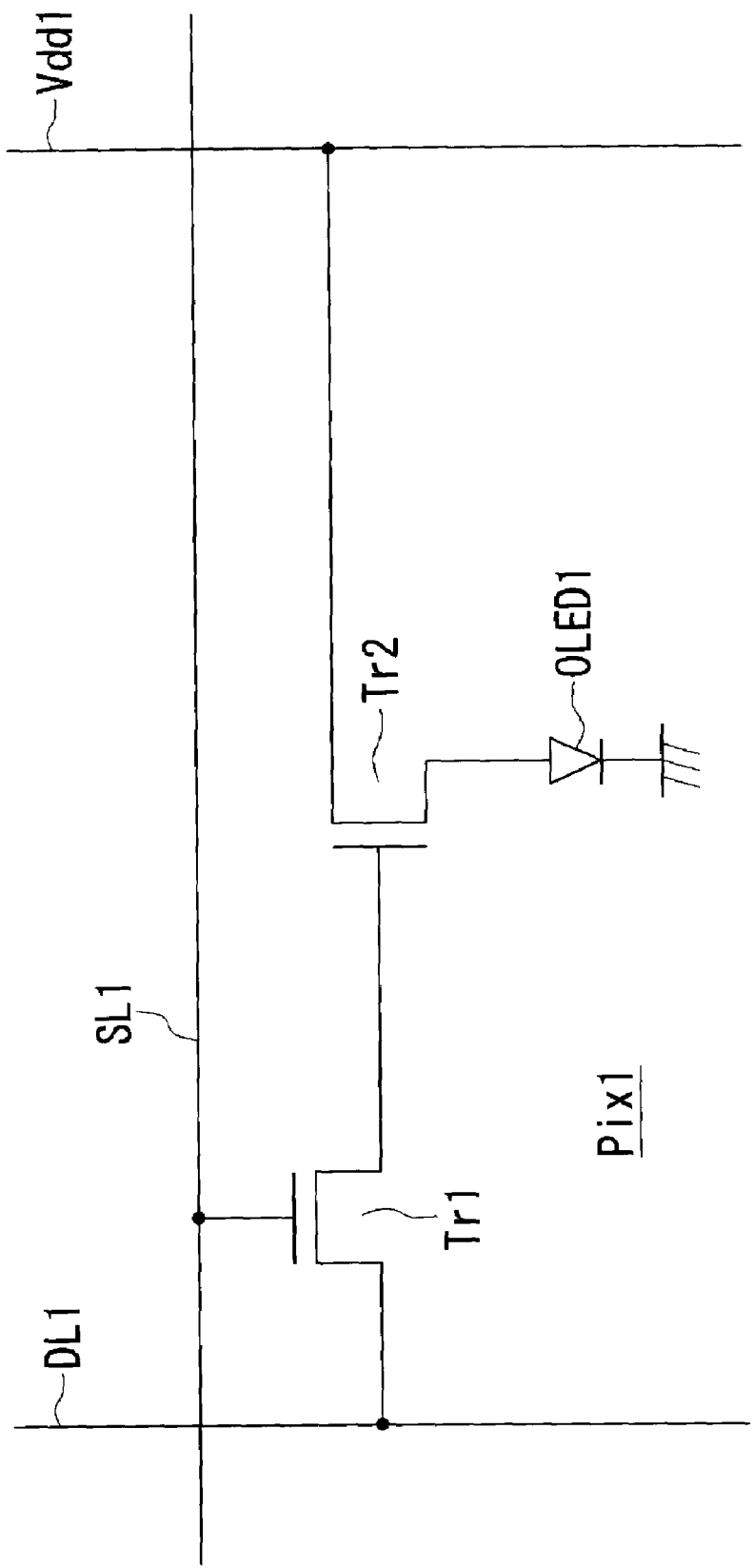
FIG. 2 shows a circuit configuration for one pixel contained in a display region according to the first embodiment.

FIG. 2 shows a circuit configuration for one pixel contained in the display region 20. A pixel Pix1 includes a first transistor Tr1 as a switching circuit, a second transistor Tr2 as a driving element and an OLED 1 as an optical element. A power supply line Vdd1 supplies electric power to have the OLED 1 emit light. The power supply line Vdd1 is provided in a layer separate from a layer provided for the first and second transistors Tr1 and Tr2, the OLED 1 and the data line DL1, and the layers are insulated against each other. By having the power supply line Vdd1 stack with the first and second transistors Tr1 and Tr2, the OLED 1 and the data line DL1, the power supply line Vdd1 may be arranged thicker in the two-dimensional direction, which will lead to a reduction in voltage drops.

The data line DL1 transmits luminance data to be written to each pixel circuit. For example, the pixel circuits belonging to the same column are connected to the same data line. The data line DL1 sends signals for luminance data to be set in the second transistor Tr2. The selection line SL1 transmits selection signals to control the on/off of the first transistor Tr1.

The first and second transistors Tr1 and Tr2 are n-channel transistors. A gate electrode of the first transistor Tr1 is connected to the selection line SL1, a drain (or source) electrode of the first transistor Tr1 is connected to the data line DL1, and the source (or drain) electrode of the first transistor Tr1 is connected to a gate electrode of the second transistor Tr2.

A source electrode of the second transistor Tr2 is connected to the power supply line Vdd1, and a drain electrode of the second transistor Tr2 is connected to an anode electrode of the OLED 1. A cathode electrode of the OLED 1 is made to be of the same potential as ground potential. The OLED 1 emits light according to the luminance data set in the gate electrode of the second transistor Tr2.

An operation procedure to be accomplished by the structure as described above is explained hereinafter. First, when a selection signal on the selection line SL1 goes high, the first transistor Tr1 turns on, thereby equalizing the potential of the data line DL1 with the gate potential of the second transistor Tr2. At this time, the first data control circuit 30 outputs data equivalent to zero of luminance data for instance, as data for use with initialization, to the data line DL1, and the value is written to the second transistor Tr2. Thereby, the OLED 1 is cut off from the power supply line Vdd1 and initialized. Immediately after this, the luminance data that must actually be set is outputted to the data line DL1, and the value is written to the second transistor Tr2. Thus, a current corresponding to the gate-source voltage of the second transistor Tr2 flows, and then the OLED 1 emits light proportional in intensity to the amount of the current.

Figure 3:
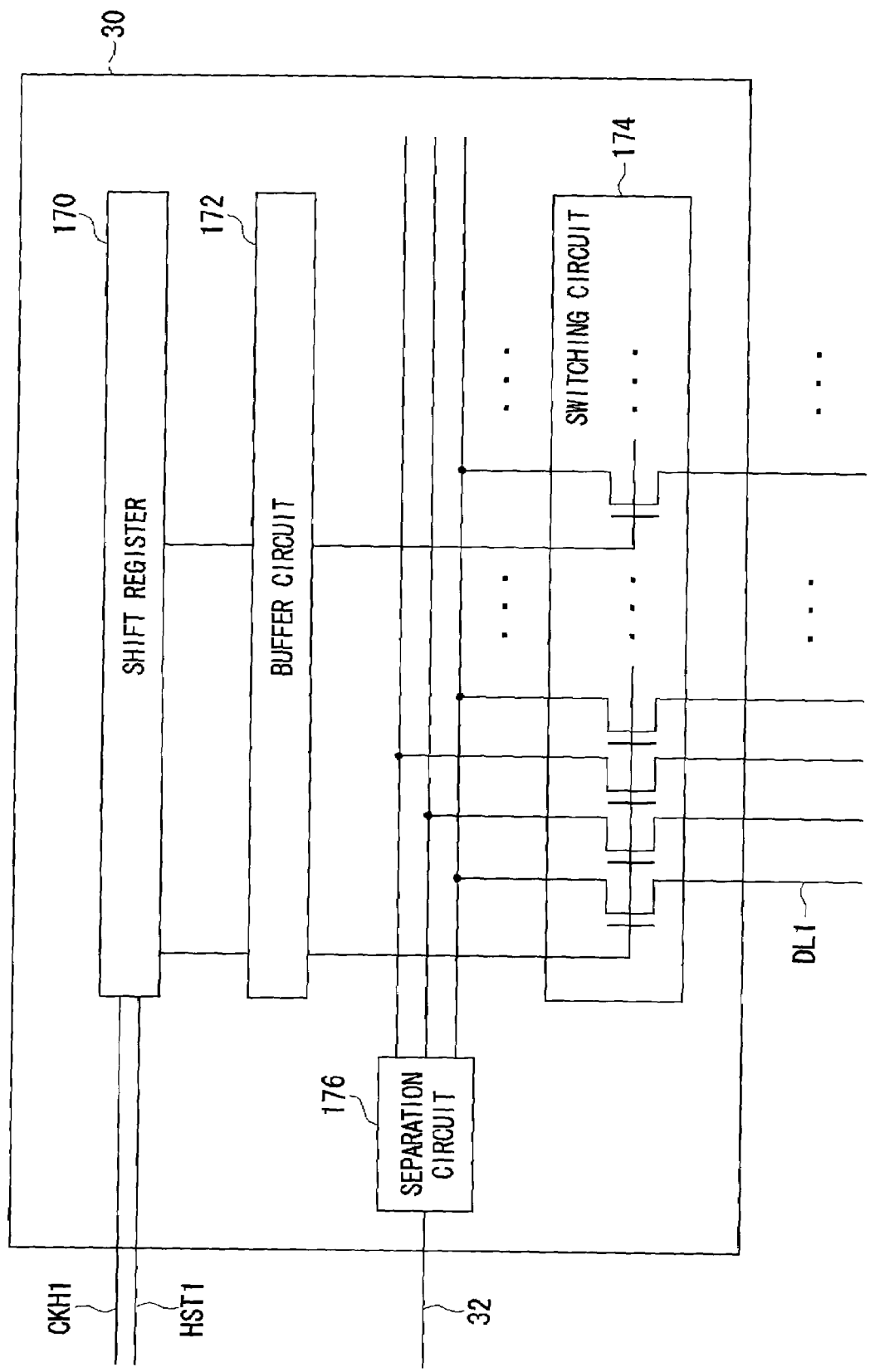
FIG. 3 shows a structure of a first data control circuit according to the first embodiment.

FIG. 3 shows a structure of the first data control circuit 30. The second clock signal CKH1 and the second set signal HST1, both inputted from the first external input terminal 70, are sent to a data shift register 170. The data shift register 170 outputs a high signal to a data buffer circuit 172 with the timing of sending luminance data to each pixel circuit. At the arrival of a high signal from the data buffer circuit 172, a data switching circuit 174 turns on, and luminance data having been sent from the first main data line 32 via a separation circuit 176 flows through the data line DL1 by way of a turned-on switch.

Switching elements contained in the data switching circuit 174 are provided in the same number as data lines. The first main data line 32 are separated into three RGB data lines by the separation circuit 176, which are further divided into eight phases of luminance data. Moreover, 24 switching elements, for eight phases of each of three colors, are turned on simultaneously, and the number of shift registers contained in the data shift register 170 and the number of buffers contained in the buffer circuit are each 1/24 of the number of switching elements contained in the data switching circuit 174.

At least part of a plurality of shift registers contained in the data shift register 170, a plurality of buffers contained in the data buffer circuit 172, and a plurality of switching elements contained in the data switching circuit 174 is formed in an overlapped manner in a stacking direction with the power supply region 50, which is provided in another layer.

Figure 4:
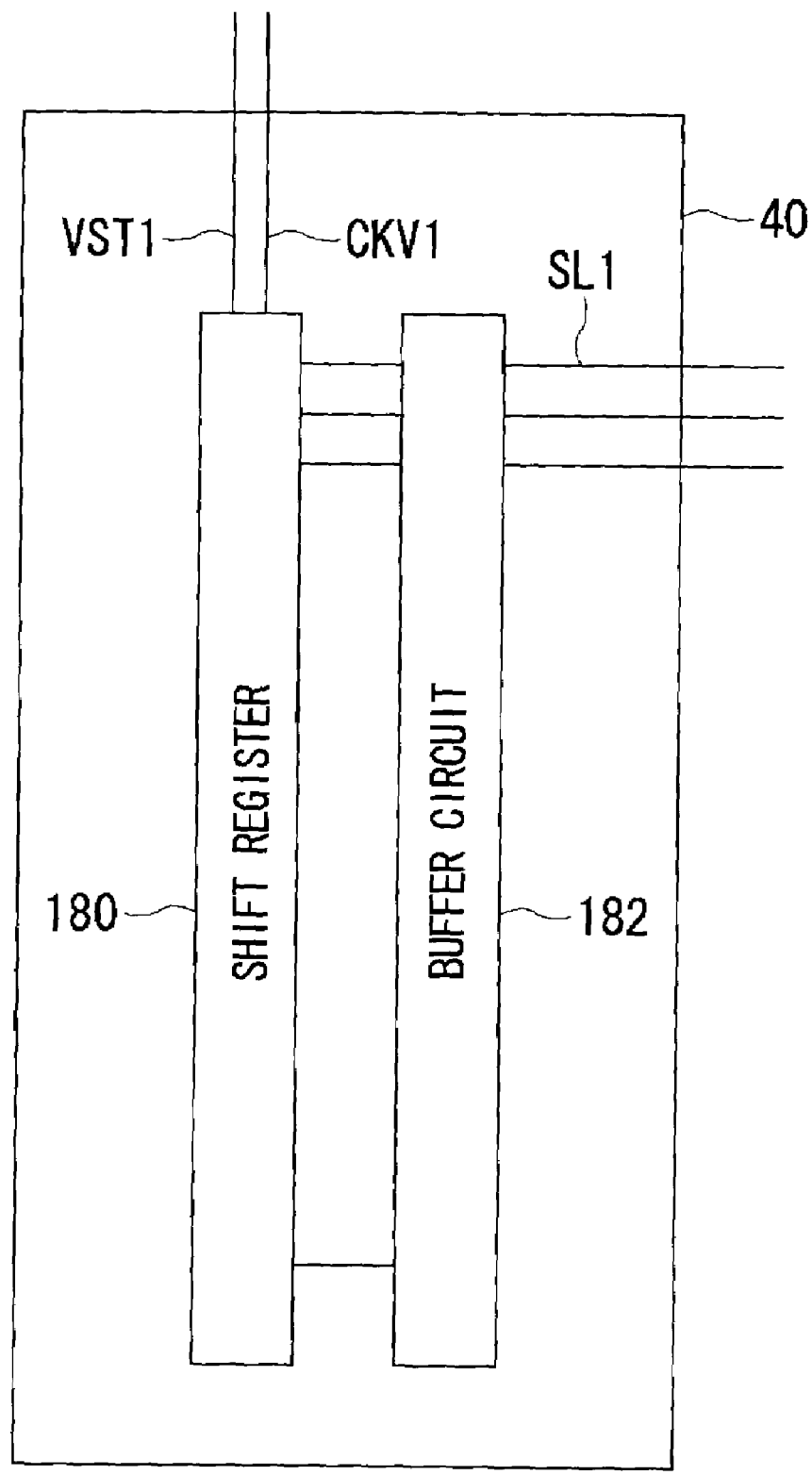
FIG. 4 shows a structure of a first selection control circuit according to the first embodiment.

FIG. 4 shows a structure of the first selection control circuit 40. In the first selection control circuit 40, a selection shift register 180 includes the same number of shift registers as the rows of a pixel circuit, and a selection buffer circuit 182 also includes the same number of buffers as the rows of a pixel circuit. The first set signal VST1 and the first clock signal CKV1 are inputted to the selection shift register 180 via the first external input terminal 70, and high signals thereof are outputted sequentially to each row of the pixel circuit and then sent to a selection line SL1 via the selection buffer circuit 182.

At least part of a plurality of shift registers contained in the selection shift register 180 and a plurality of buffers contained in the selection buffer circuit 182 is formed in an overlapped manner in a stacking direction with the power supply region 50, which is provided in another layer.

Figure 5:
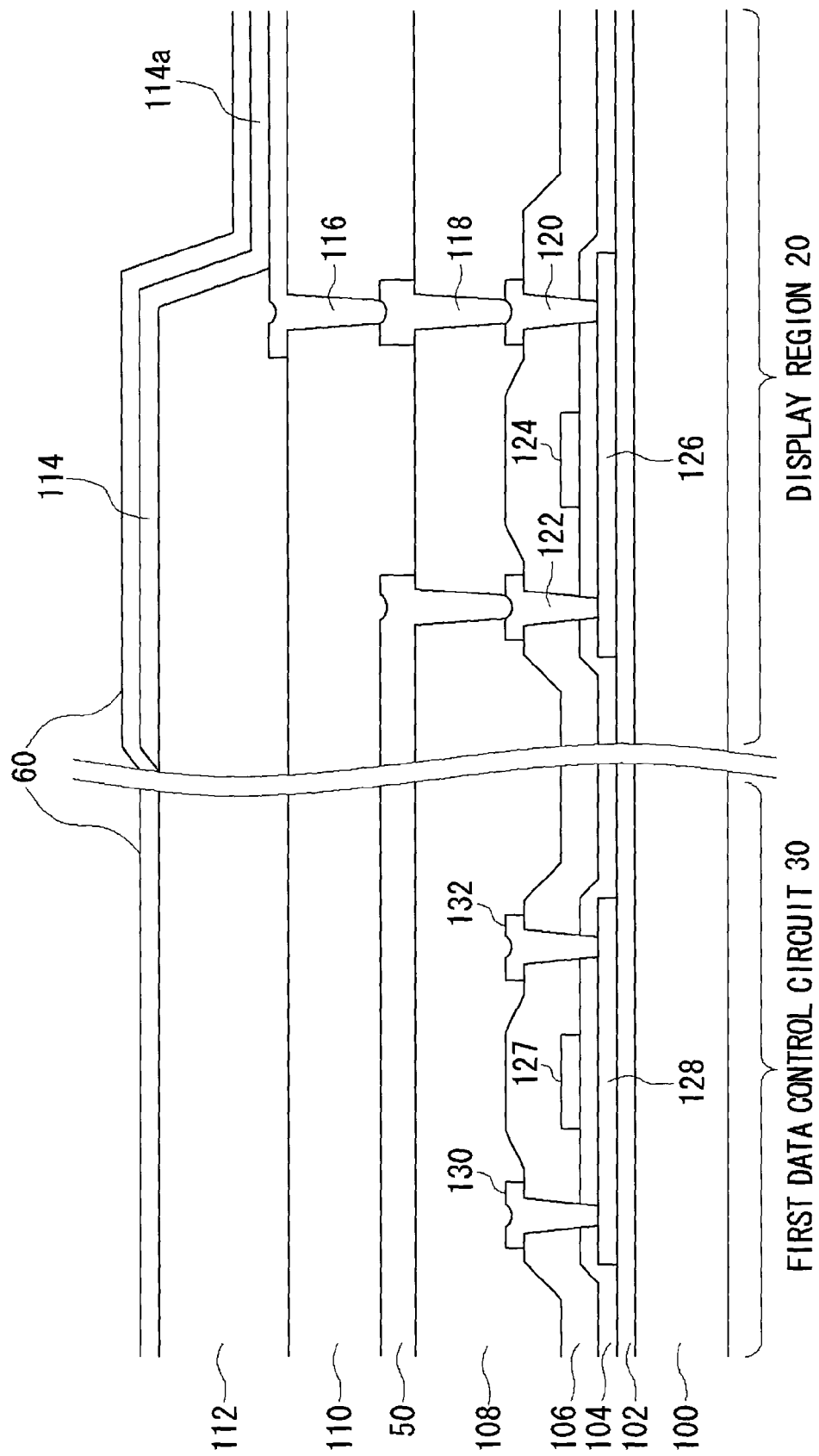
FIG. 5 shows a cross-sectional view of a display apparatus according to the first embodiment.

FIG. 5 shows a cross-sectional view of a display apparatus. FIG. 5 mainly shows how the power supply region 50, the first data control circuit 30 and the display region 20 are overlapped with each other. Transistors, which are switching elements contained in the data switching circuit 174 of the first data control circuit 30, (hereinafter referred to as data control transistors) are provided on a substrate 100. More specifically, a second polysilicon layer 128 is deposited through a barrier insulating film 102 on the substrate 100, and further on top of it are deposited a gate insulating film 104, a first interlayer insulating film 106 and a second interlayer insulating film 108 in this order. The power supply region 50 is formed on the second interlayer insulating film 108.

The data control transistor is comprised of a third source/drain electrode 130 and a fourth source/drain electrode 132, both so formed as to be electrically conductive to the second polysilicon layer 128, and a second gate electrode 127 formed on the gate insulating film 104. The third source/drain electrode 130 and the fourth source/drain electrode 132 penetrate the layers from the top surface of the second polysilicon layer 128 to the top surface of the first interlayer insulating film 106. This data control transistor and the power supply region 50 not only overlap each other in the stacking direction but also are insulated against each other by the second interlayer insulating film 108.

A third interlayer insulating film 110 and a fourth interlayer insulating film 112 are formed and stacked in a layer over the power supply region 50, and the cathode region 60 is further provided on the fourth interlayer insulating film 112.

In the display region 20, a second transistor Tr2, which is a drive element, is provided on the substrate 100. The second transistor Tr2 is comprised of a second source/drain electrode 122, a first source/drain electrode 120 and a first gate electrode 124. The second source/drain electrode 122 and the first source/drain electrode 120 are provided on the first polysilicon layer 126 deposited on the substrate 100 and are electrically conductive to the first polysilicon layer 126. The first gate electrode 124 is provided on the gate insulating film 104 formed and stacked in a layer over the first polysilicon layer 126.

The second source/drain electrode 122 is connected via a contact to and is electrically conductive to a power supply line in the power supply region 50 provided in a layer above the second interlayer insulating film 108. A third interlayer insulating film 110 and a fourth interlayer insulating film 112 are formed in a layer over the power supply region 50, and an organic EL layer 114 and a cathode region 60 are further provided thereon. The organic EL layer 114 is totally in contact with the cathode region 60, which overlaps it from above.

A pixel electrode 116 is provided on the third interlayer insulating film 110, and the organic EL layer 114 is connected to the pixel electrode 116 via a contact portion 114a. The pixel electrode 116 is connected to the first source/drain electrode 120 via a contact 118. As a result thereof, the power supply line in the power supply region 50 conducts electricity to the pixel electrode 116 through the second source/drain electrode 122, the first polysilicon layer 126, the first source/drain electrode 120 and the contact 118, so that the organic EL layer 114 emits light.

Second Embodiment

Figure 6:
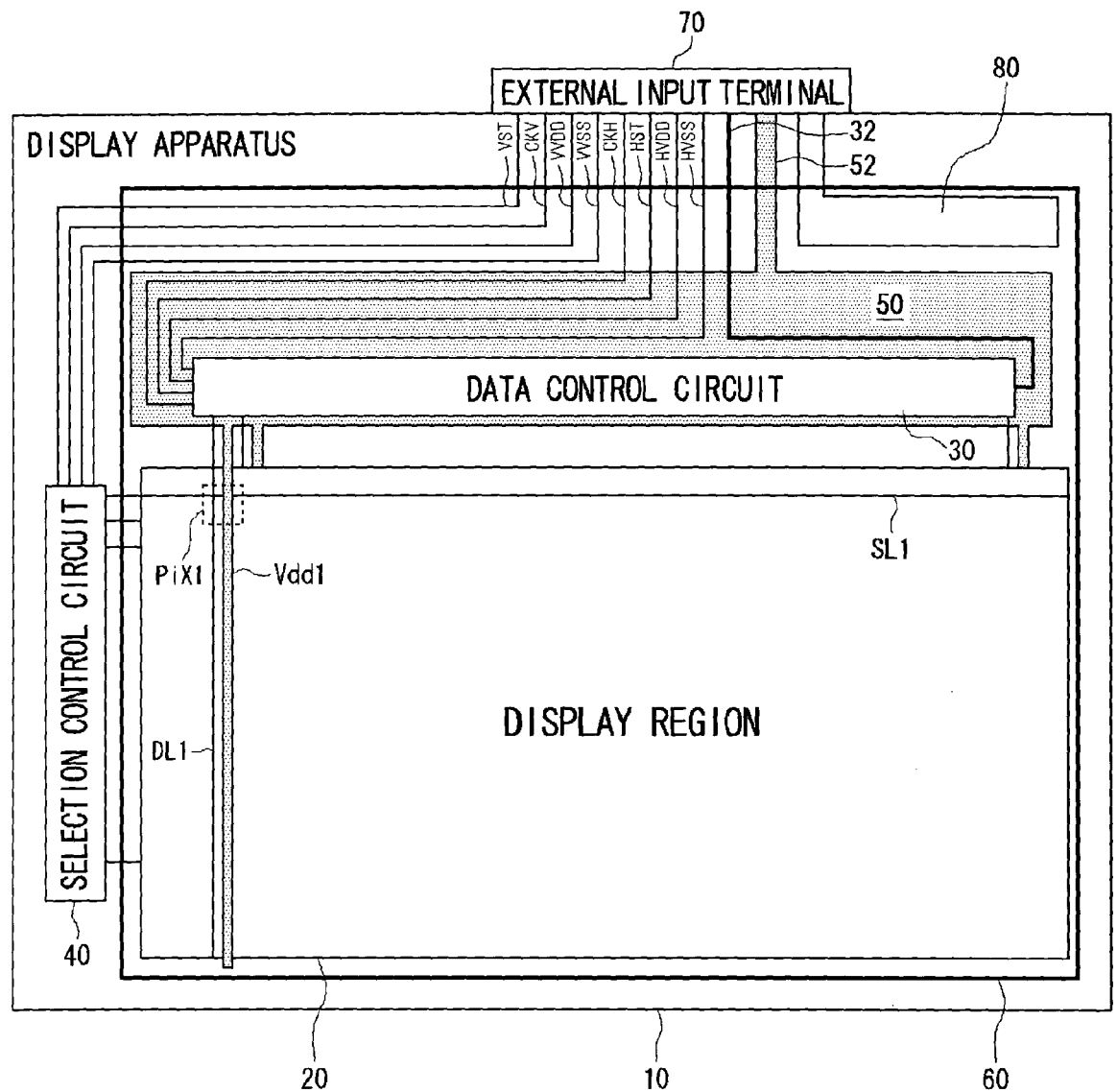
FIG. 6 shows a structure of a display apparatus according to a second embodiment of the present invention.

FIG. 6 shows a structure of a display apparatus according a second embodiment. This second embodiment differs from the first embodiment in that the area by which the power supply region 50 overlaps in the stack direction with the data control circuit and the signal lines and the like connected thereto is smaller. It also differs from the first embodiment in that there is provided only one each of the external input terminal, the data control circuit and the selection control circuit.

Also in this second embodiment, the power supply region 50 is provided in a layer separate from those for various other circuits and signal lines, which produces such effects as reduced voltage drops, smaller size for peripheral circuits and protection against noise or static electricity. Moreover, since many circuits and signal lines transmitting the luminance data are disposed in the first data control circuit 30, the structure realized by the second embodiment produces significant effects where the part thereof overlapping the power supply region 50 is protected from noise and static electricity.

Third Embodiment

Figure 7:
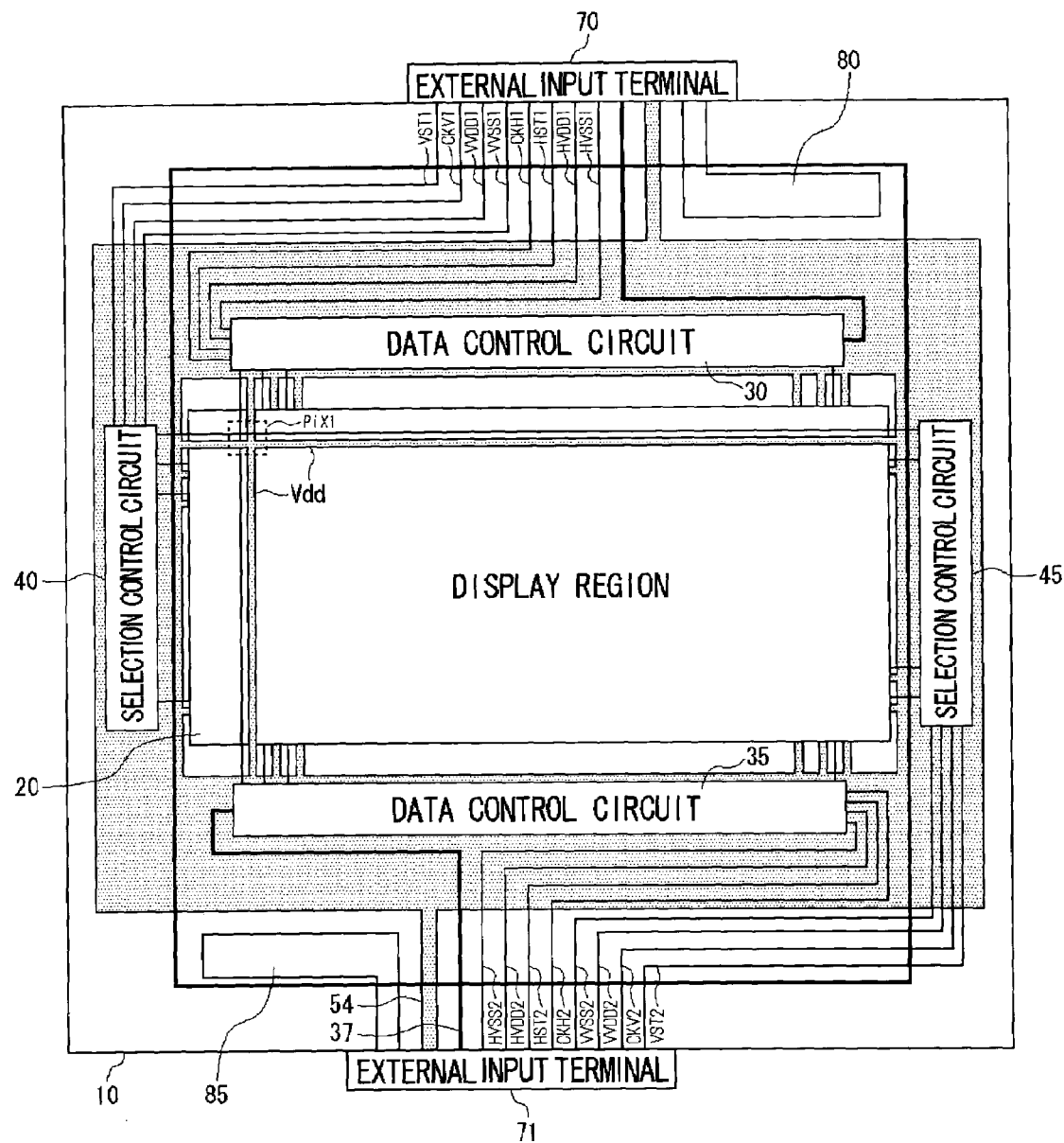
FIG. 7 shows a structure of a display apparatus according to a third embodiment of the present invention.

FIG. 7 shows a structure of a display apparatus according to a third embodiment. This third embodiment differs from the first embodiment in that the power supply lines Vdd overlapping the display region 20 are formed in a mesh both in the column and row directions of the display region 20. Since the power supply lines are provided in a layer other than that for the transistors and OLED contained in each pixel circuit of the display region 20, the power supply lines may be wired with thicker lines without interfering with other circuits. Furthermore, the mesh-like wiring, that is, the interconnection in both column and row directions can make the total area of the power supply lines larger than in the first embodiment, so that a greater reduction in voltage drops is achieved in this third embodiment.

Fourth Embodiment

Figure 8:
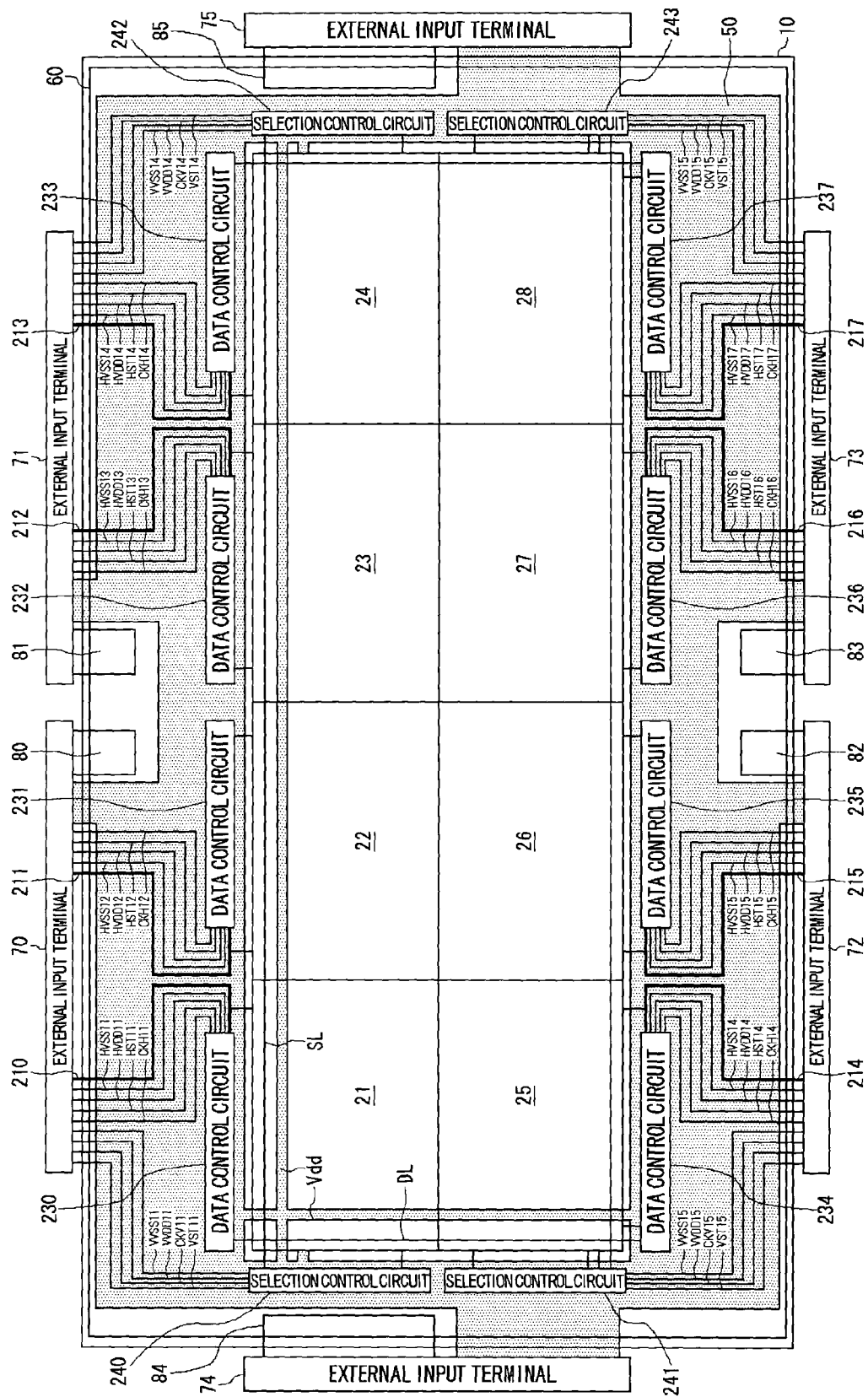
FIG. 8 shows a structure of a display apparatus according to a fourth embodiment of the present invention.

FIG. 8 shows a structure of a display apparatus according to a fourth embodiment. This fourth embodiment differs from the first to third embodiments in that there are six external input terminals, eight data control circuits, four selection control circuits and six cathode contacts. Connected to a first external input terminal 70 are first and second data control circuits 230 and 231, signal lines to input signals to a first selection control circuit 240, a power supply region 50 and a first cathode contact 80. Third and fourth data control circuits 232 and 233, signal lines to input signals to a second selection control circuit 242, the power supply region 50 and a second cathode contact 81 are connected to a second external input terminal 71. Fifth and sixth data control circuits 234 and 235, signal lines to input signals to a third selection control circuit 241, the power supply region 50 and a third cathode contact 82 are connected to a third external input terminal 72. Seventh and eighth data control circuits 236 and 237, signal lines to input signals to a fourth selection control circuit 243, the power supply region 50 and a fourth cathode contact 83 are connected to a fourth external input terminal 73. A fifth external input terminal 74 is connected to the power supply region 50 and a fifth cathode contact 84, and a sixth external input terminal 75 is connected to the power supply region 50 and a sixth cathode contact 85.

A display region 20 according to the fourth embodiment is such that a plurality of pixel circuits are divided into eight sub-regions 21 to 28, which are two vertical times four horizontal (2×4) sub-regions. The eight data control circuits and the four selection control circuits operating for their respective sub-regions increase the amount of simultaneous writing of luminance data to the pixel circuits. A division design like this helps to realize not only more efficient processing but also more efficient layout of the circuits and signal lines. Namely, the wiring length may be shortened and layout symmetry may be maintained. The vertical as well as horizontal symmetry, as shown in FIG. 8, contributes toward realizing smaller size for the peripheral circuits. Moreover, since the power supply region 50 is provided in a separate layer to avoid interference with the other circuits, the signal lines may be interconnected easily despite the division of the display region 20.

The present invention has been described based on the embodiments which are only exemplary. It is understood by those skilled in the art that there exist other various modifications to the combination of each component and process described above and that such modifications are encompassed by the scope of the present invention. Such modified examples will be described hereinbelow.

Two or more transistors, which serve as switching circuits according to the present embodiments, may be connected in series. In such a configuration, the characteristics of the transistors, such as current amplification factor, may be made to differ from one another. For example, the current amplification factor of a transistor closer to a transistor serving as a driving element may be set lower to reduce leakage current.

Moreover, the characteristics of these transistors and drive transistors may be made different from each other. For example, the current amplification factor of a drive transistor may be set low so as to widen the range of setting data for the same luminance range, thus making the control of luminance easier.

Although the present invention has been described by way of exemplary embodiments, it should be understood that many changes and substitutions may further be made by those skilled in the art without departing from the scope of the present invention which is defined by the appended claims.

What is claimed is:

1. A display apparatus, including:
   a pixel circuit;
   a display control circuit which controls said pixel circuit; and
   a supply region for supplying a predetermined voltage used to drive said pixel circuit,
   wherein said pixel circuit, said display control circuit and said supply region are formed by a stacking process in a manner such that at least one of a data line transmitting luminance data and a selection line transmitting a write timing signal for the luminance data, which lines are connected to said display control circuit, overlaps with said supply region in a stacking direction thereof.

2. A display apparatus according to claim 1, wherein said pixel circuit is arranged in a matrix so as to form a display region, and said display control circuit outputs a data signal in a column direction thereof.

3. A display apparatus according to claim 1, wherein said pixel circuit is arranged in a matrix so as to form a display region, and said display control circuit outputs a selection signal in a row direction thereof.

4. A display apparatus, including:
   a display region in which a plurality of pixel circuits are arranged in a matrix;

a display control circuit, disposed outside said display region, which controls the plurality of pixel circuits in a row or column direction;

a supply region for supplying a predetermined voltage used to drive the plurality of pixel circuits; and a connecting member which electrically connects the display apparatus to an external unit, so as to introduce a signal to be referred to by said display control circuit and the predetermined voltage, wherein said pixel circuit, said display control circuit and said supply region are formed by a stacking process in a manner such that at least one of a data line transmitting luminance data and a selection line transmitting a write timing signal for the luminance data, which lines are connected to said display control circuit, overlaps with said supply region in layers from said connecting member up to said supply region in a stacking direction thereof.

5. A display apparatus, including:

a pixel circuit;

a display control circuit which controls said pixel circuit; and a supply region for supplying a predetermined voltage used to drive said pixel circuit, wherein said pixel circuit, said display control circuit and said supply region are formed in a plurality of stacking layers and formed in a manner such that at least one of a data line transmitting luminance data and a selection line transmitting a write timing signal for the luminance data, which lines are connected to said display control circuit, overlaps with said supply region in a stacking direction thereof.

6. A display apparatus according to claim 1, wherein said display control circuit includes at least one of a shift register, a buffer and a switching circuit and wherein the at least one element is formed in such a manner as to overlap with said supply region supplying the predetermined voltage.

7. A display apparatus according to claim 4, wherein said display control circuit includes at least one of a shift register, a buffer and a switching circuit and wherein the at least one element is formed in such a manner as to overlap with said supply region supplying the predetermined voltage.

8. A display apparatus according to claim 5, wherein said display control circuit includes at least one of a shift register, a buffer and a switching circuit and wherein the at least one element is formed in such a manner as to overlap with said supply region supplying the predetermined voltage.

9. A display apparatus according to claim 4, wherein the signal to be referred to is at least one of luminance data, a clock signal and a start signal.

10. A display apparatus according to claim 4, wherein said electrically connecting member is an external input terminal and wherein said supply region supplying the predetermined voltage is formed in such a manner as to overlap with said display control circuit or a wiring region for the signal to be referred to in a layer from the external input terminal up to said display region.

11. A display apparatus according to claim 4, wherein at least part of a region, in which the signal to be referred to is interconnected, is formed in such a manner as to overlap with said supply region supplying the predetermined voltage.

12. A display apparatus according to claim 4, wherein a plurality of said connecting members are provided in the periphery of the display apparatus, a plurality of said display control circuits are provided according to the number of said connecting members, the number of the signals to be referred to and a region thereof to be interconnected are determined according to the number of said connecting members and display control circuits, and wherein said display control circuits, the wiring region and said supply region are formed in a manner such that at least part of the plurality of said display control circuits and the wiring region for the plurality of signals to be referred to is overlapped with said supply region in layers from the plurality of connecting members up to said display region.

13. A display apparatus according to claim 4, wherein said connecting member is provided on either above or below the display apparatus, or is provided on both above and below the display apparatus, for one each or two each thereof.

14. A display according to claim 4, wherein said connecting member is provided on both left and right sides of the display apparatus, and each of the thus provided connecting members includes a power supply terminal of anode and cathode.

15. A display apparatus according to claim 12, wherein positions and layout of the plurality of connecting members, the plurality of interconnection for the signals to be referred to and the plurality of display control circuits are arranged in a manner such that vertical or horizontal symmetry is maintained.

16. A display apparatus according to claim 12, wherein said supply region is formed in a manner such that at least one of the plurality of connecting members, the plurality of interconnection for the signals to be referred to and the plurality of display control circuits is substantially uniformly overlapped with said supply region in a vertical or horizontal direction.

17. A display apparatus according to claim 12, wherein said display region constituted by a plurality of pixel circuits are divided into sub-regions.

18. A display apparatus according to claim 1, wherein said pixel circuit includes an organic light emitting diode as an optical element.

19. A display apparatus according to claim 4, wherein said pixel circuit includes an organic light emitting diode as an optical element.

20. A display apparatus according to claim 5, wherein said pixel circuit includes an organic light emitting diode as an optical element.

* * * * *